United States Patent [19]
Miyata

[11] Patent Number: 5,089,798
[45] Date of Patent: Feb. 18, 1992

[54] APPARATUS FOR GENERATING UNIFORM MAGNETIC FIELD USING SMALL DIAMETER SPHERICAL METALLIC MEMBERS PROVIDED ON MAGNETIC POLES

[75] Inventor: Koji Miyata, Fukui, Japan

[73] Assignee: Shin-Etsu Chemical Co., Ltd., Tokyo, Japan

[21] Appl. No.: 627,145

[22] Filed: Dec. 13, 1990

[30] Foreign Application Priority Data

Dec. 13, 1989 [JP] Japan .................. 1-143987[U]

[51] Int. Cl.$^5$ .................. H01F 3/12; H01F 7/00; H01F 3/00; H01F 7/02
[52] U.S. Cl. .................. 335/211; 335/214; 335/297; 335/301; 335/304; 335/306
[58] Field of Search ............... 335/211, 214, 301, 304, 335/306

[56] References Cited

U.S. PATENT DOCUMENTS 4,706,057 11/1987 Schwab ........................ 335/304
4,777,464 10/1988 Takabashi ..................... 335/306

Primary Examiner—Leo P. Picard
Assistant Examiner—Ramon M. Barrera
Attorney, Agent, or Firm—Sughrue, Mion, Zinn, Macpeak & Seas

[57] ABSTRACT

Two disc shaped permanent magnets are provided within a yoke structure in a manner to face one another. Two pole pieces are disposed on the surfaces of the two magnets respectively. Small spherical metallic members which induce a localized increase in magnetic field strength, are attached to the surfaces of the opposed pole pieces at selected locations in a manner which unifies the magnetic field produced.

6 Claims, 2 Drawing Sheets

APPARATUS FOR GENERATING UNIFORM MAGNETIC FIELD USING SMALL DIAMETER SPHERICAL METALLIC MEMBERS PROVIDED ON MAGNETIC POLES

BACKGROUND OF THE INVENTION

1. Field of the Invention

The present invention relates to an apparatus for generating a uniform magnetic field and more specifically to an arrangement in which a plurality of small spheres of magnetic material are provided on magnetic pole pieces in order to finely adjust the uniformity of the magnetic field produced. The present invention has found an extensive application wherein a highly uniform magnetic field is required, such as in nuclear magnetic resonance computer tomography (NMR-CT).

2. Description of the Prior Art

The uniformity of the magnetic field which is used in connection with NMR-CT has a very large effect on the clarity and resolution of a NMR-CT image. Accordingly, it is of extreme importance that the magnetic field uniformity is increased to the maximum possible limit.

In order to improve the uniformity of such a magnetic field, it has been proposed to provide, within a yoke, a pair of opposed circular disc type permanent magnets each of which is magnetized in a direction of thickness and each of which is provided with a pole piece thereon. The pole piece has an annular projection about the periphery thereof.

It has also been proposed to dispose additional members (both fixed and movable) about the perimeter of the annular projections in order to deflect the outwardly curving lines of magnetic flux which tend to be produced at the outer peripheral zones of the magnets, inwardly in an effort to straighten the same to the greatest possible degree.

However, these efforts have not met with particular success in that the compensating or correcting members are provided about the periphery of the magnetic poles. In other words, the magnetic field correcting members are positioned remote from the uniform magnetic field produced, and hence are unable to effectively adjust or correct the magnetic field.

SUMMARY OF THE INVENTION

It is an object of the present invention to provide a simple arrangement via which the minor deviations induced in the magnetic field by imperfect production (for example) can be corrected and thus enables the generation of a highly unformed magnetic field.

In brief, the above object is achieved by disposing small metallic members which induce a localized increase in magnetic field strength, at selected locations on the surfaces of opposed pole pieces. The diameters of the spheres is limited so as to avoid over corrective influences.

More specifically, a first aspect of the present invention comes in a device for producing a magnetic field which features: a disc shaped permanent magnet; a circular pole piece attached to said magnet, said circular pole piece having an annular projection which extends above a major surface of the pole piece; and means for correcting non-uniformity in the magnetic field produced by said magnet, said correcting means comprising at least one small diameter metallic spherical member fixed to the major surface of said pole piece.

A second aspect of the present invention comes in a device for producing a magnetic field which features: first and second disc shaped magnets; yoke means for operatively interconnecting said magnets and establishing a magnetic circuit with said magnets; first and second pole pieces disposed on said first and second disc shaped magnets respectively, in a manner to face one another; and a plurality of small diameter metallic bodies which are fixed to the surfaces of the pole pieces.

Another feature of the present invention comes in a device for producing a magnetic field which features: magnet means; means defining a surface associated with said magnet means, said surface being directly associated with the generation of a magnetic field; means for adjusting the uniformity of the magnetic field, comprising a plurality of small metallic members which are secured to said surface at locations selected in accordance with a measured level of uniformity of the magnetic field.

BRIEF DESCRIPTION OF THE DRAWINGS

The features and advantages of the present invention will become more clearly appreciated from the following description taken in conjunction with the accompanying drawings in which like elements are denoted by like reference numerals and in which.

DETAILED DESCRIPTION OF THE PREFERRED EMBODIMENTS

Figure 1:
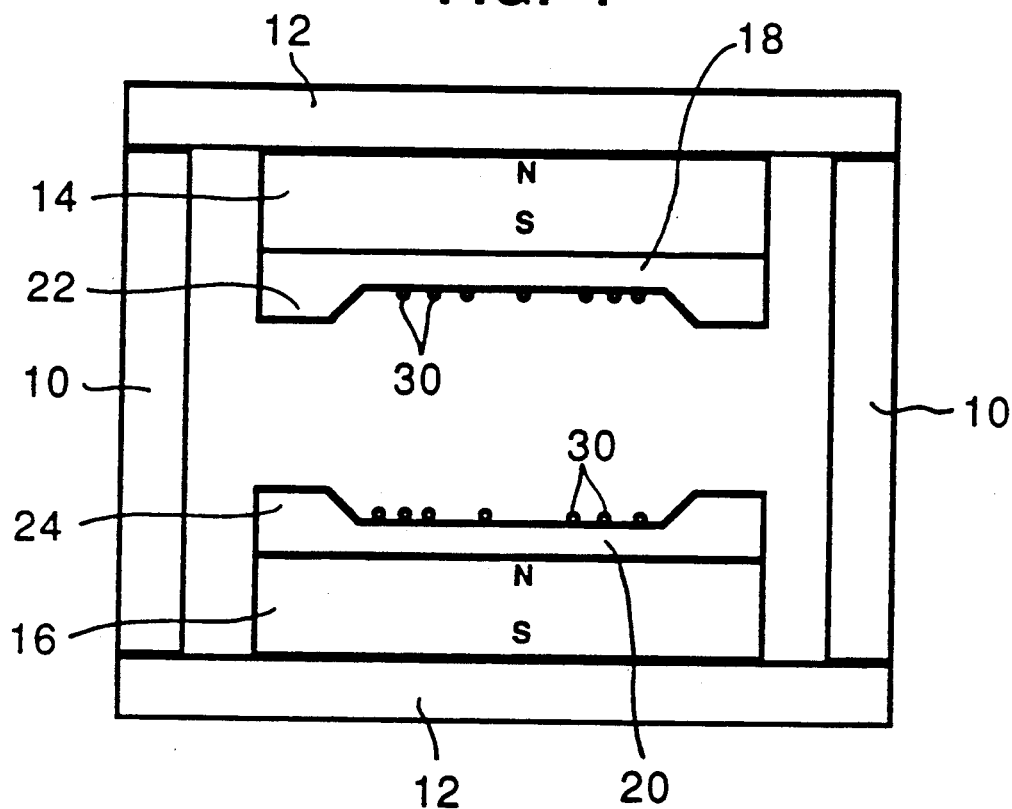
FIG. 1 is a sectional side elevation showing an embodiment of the present invention.
Figure 2:
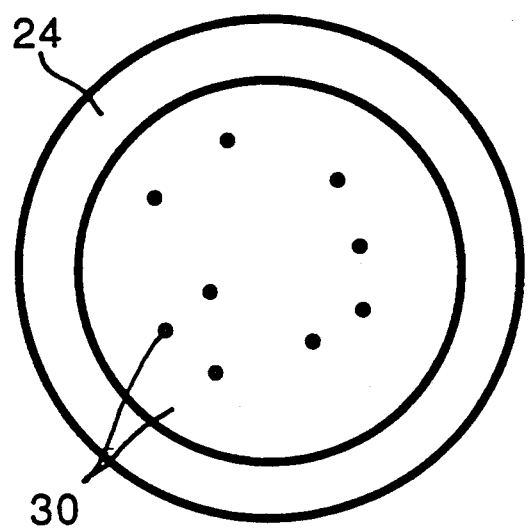
FIG. 2 is a plan view showing the top surface of the lower pole piece shown in FIG. 1

FIGS. 1 and 2 show a first embodiment of the present invention.

In this arrangement yoke members 10 and 12 are arranged to enclose and operatively connected to circular disc shaped permanent magnets 14, 16. Each of the permanent magnets 14, 16 is previously magnetized in a direction of the thickness thereof. Pole pieces 18, 20 are disposed on the inboard faces of the permanent magnets 14, 16 respectively. These pole pieces 18, 20 are formed with annular projections 22, 24 about the external peripheries thereof. As best seen in FIG. 1 the projections 22, 24 extend toward one other and are formed with an chamfered inner edges.

In accordance with the present invention, the inboard surfaces of the pole pieces 18, 20 which are respectively surrounded by the annular projections 22, 24 and which face toward one another, have a plurality of small diameter metallic spheres 30 attached thereto. These spheres 30 are disposed at points in a manner to correct the minor or local lack of uniformity in the magnetic field. Accordingly, the location of each of the spheres 30 depends on an apparatus and also on the environments in which an apparatus is installed.

The spheres 30 increase the strength of the magnetic field in their immediate vicinity. Accordingly, it is understood that (a) each of the spheres 30 is disposed within a uniform magnetic field zone in which measurement is to be effected and (b) is provided in a small zone in which the magnetic field strength should be increased to be unified to a very high degree.

In the event that the diameter of the spheres is 5 mm or grater, the effect on the magnetic field tends to be excessive and results in overcorrection and a resulting deterioration of the magnetic field uniformity. Accordingly, it is preferred in the disclosed embodiments to use spheres each of which has a diameter less than 5 mm.

In the instant embodiment the spherical members 30 are used. This comes from the fact that the use of elongated members renders the attachment thereof to the pole pieces difficult due to shape anisotropy thereof.

In order to stably dispose the spheres 30 in place on the surfaces of the pole pieces 22, 24, the spheres 30 may be attached by setting the same in thermosetting resins (e.g. epoxy resin, polyester resin, polyurethane resin etc.), adhesive (e.g. adhesive of the epoxy, polyurethane, acryl, vinyl type etc.) or rubbers which exhibit a suitable hardness at room temperature (e.g. silicon rubber, urethane rubber, polysulphide rubber etc.). As an alternative, the spheres 30 may be partially embedded in the surfaces of the pole pieces 22, 24.

Experiments were conducted using Nd-Fe-B type permanent magnets wherein:
Br (residual magnetic flux density) = 12.2 KG;
(BH)max (maximum energy product) = 35 MGoe;
the pole pieces were made of carbon steel (SS41); and the separation of the pole pieces was 52 cm and the zone
in which it is essential for the magnetic field to be uniform is a sphere with a diameter of 40 cm.

Before the spheres 30 are attached, the central magnetic field was 2002 G (Gauss) and the field uniformity was 299 ppm.

The uniformity characteristics of the uniform zone were determined as follows:

$$(MFmax - MFmin)/MFav$$

wherein
MFmax: maximum magnetic field strength in the uniform zone;
MFmin: minimum magnetic field strength in the uniform zone; and
MFav: average magnetic field strength in the uniform zone.

Measurements were made at 72 points on the surface of the spherical magnetic field. The attachment of a plurality of the spheres 30 permitted the uniformity to be improved to 48.5 ppm with a central magnetic field of 2002 G.

Thus, as will be appreciated from the foregoing, the object of the disposition of the small diameter metallic spheres 30 is one of correcting non-uniform magnetic fields which results from minor imperfections and/or dimensional deviations in the magnets and/or pole pieces (for example).

Figure 3:
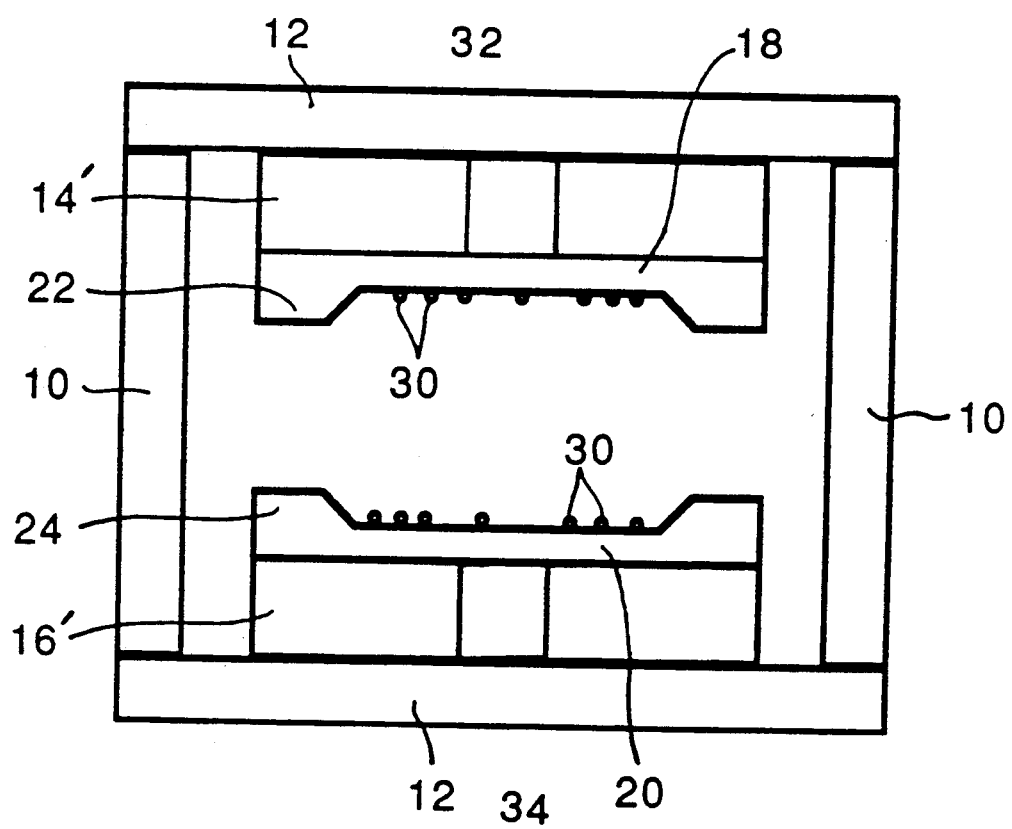
FIG. 3 is a plan view showing the top surface of a pole piece according to a variant of the present invention.

FIG. 3 shows a second embodiment of the present invention, wherein each of disc shaped permanent magnets 14' and 16' has a concentric circuit openings 32 and 34 respectively. Other than this is identical to the first embodiment. As well known in the art, the forming of a concentric circular opening 32 in a disc shaped magnet is advantageous for generating a uniform magnetic field. Further descriptions of the second embodiment are deemed unnecessary and hence will be omitted for brevity.

It should be noted that the concept of attaching small metallic bodies to the surfaces of pole pieces is not limited to the specific embodiments given in the instant disclosure and that various modifications can be made without departing from the scope of the present invention.

What is claimed is:

1. In a device for producing a magnetic field,
a disc shaped permanent magnet;
a circular pole piece attached to said magnet, said circular pole piece having an annular projection which extends above a major surface of the pole piece; and
means for correcting non-uniformity in the magnetic field produced by said magnet, said correcting means comprising at least one small diameter metallic spherical member fixed to the major surface of said pole piece.

2. A device as claimed in claim 1, wherein the diameter of the at least one small diameter metallic spherical member is less than 5 mm.

3. A device as claimed in claim 1, wherein said magnet has a concentric circular opening formed therein.

4. A device for producing a magnetic field comprising:
first and second disc shaped magnets;
yoke means for operatively interconnecting said magnets and establishing a magnetic circuit with said magnets;
first and second pole pieces disposed on said first and second disc shaped magnets respectively, in a manner to face one another; and
a plurality of small diameter metallic bodies which are fixed to the surfaces of the pole pieces.

5. A device as claimed in claim 4, wherein the diameter of each of the small diameter metallic bodies is less than 5 mm.

6. A device as claimed in claim 4, wherein each of said first and second disc shaped permanent magnets has a concentric circular opening formed therein.

* * * * *